United States Patent
Kamimura et al.

(10) Patent No.: US 9,904,335 B2
(45) Date of Patent: Feb. 27, 2018

(54) COOLING DEVICE FOR COOLING PORTABLE INFORMATION DEVICES

(71) Applicant: LENOVO (SINGAPORE) PTE. LTD., Singapore (SG)

(72) Inventors: Takuroh Kamimura, Kanagawa-ken (JP); Hiroaki Agata, Kanagawa-ken (JP); Akinori Uchino, Kanagawa-ken (JP); Tomoaki Kosugi, Kanagawa-ken (JP); Yoshiyuki Shibayama, Gunma-ken (JP); Eiji Shinohara, Kanagawa-ken (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 15/372,151

(22) Filed: Dec. 7, 2016

(65) Prior Publication Data

US 2017/0160772 A1    Jun. 8, 2017

(30) Foreign Application Priority Data

Dec. 7, 2015   (JP) .................................. 2015-238260

(51) Int. Cl.
| | |
|---|---|
| *G06F 1/16* | (2006.01) |
| *G06F 1/20* | (2006.01) |
| *H05K 7/20* | (2006.01) |

(52) U.S. Cl.
CPC ............ *G06F 1/203* (2013.01); *G06F 1/1616* (2013.01); *G06F 1/1632* (2013.01);
(Continued)

(58) Field of Classification Search
CPC ................................ G06F 1/1632; G06F 1/203
See application file for complete search history.

(56) References Cited

U.S. PATENT DOCUMENTS 5,126,954 A * 6/1992 Morita ................... G06F 1/1632
                                                                361/679.33
6,084,769 A * 7/2000 Moore ................... G06F 1/1632
                                                                165/104.33
(Continued)

FOREIGN PATENT DOCUMENTS

| JP | 1994-266474 A | 9/1994 |
| JP | 1999-053063 A | 2/1999 |

(Continued)

*Primary Examiner* — Adrian S Wilson
(74) *Attorney, Agent, or Firm* — Russell Ng PLLC; Antony P. Ng

(57) ABSTRACT

An electronic apparatus capable of achieving sufficient heat transfer efficiency between a portable information device and a cooling device while preventing a heating member from being exposed at an outer surface of the portable information device is disclosed. The portable information device includes a heating body and a cooling device. The cooling device is detachably connected to the portable information device, and is configured to absorb heat from the heating body. The portable information device includes a heat-dissipation heat sink thermally connected to the heating body, and multiple apparatus shutter members covering the heat-dissipation heat sink so that the heat-dissipation heat sink can be freely covered and uncovered. The cooling device includes a shutter driving mechanism that opens the apparatus shutter members when the portable information device is connected to the cooling device, and a heat-receiving heat sink thermally connected to the heat-dissipation heat sink.

11 Claims, 14 Drawing Sheets

(52) U.S. Cl.
CPC ....... *G06F 1/1679* (2013.01); *H05K 7/20254* (2013.01); *H05K 7/20263* (2013.01); *H05K 7/20272* (2013.01); *H05K 7/20418* (2013.01)

(56) References Cited

U.S. PATENT DOCUMENTS

| | | | | |
|---|---|---|---|---|
| 6,646,874 | B2* | 11/2003 | Pokharna | G06F 1/1632 361/679.09 |
| 6,845,008 | B2* | 1/2005 | Pokharna | G06F 1/1632 165/104.33 |
| 6,966,358 | B2* | 11/2005 | Rapaich | G06F 1/1632 165/104.33 |
| 7,342,783 | B2* | 3/2008 | Park | G06F 1/1632 165/80.3 |
| 2001/0033475 | A1* | 10/2001 | Lillios | G06F 1/1632 361/679.54 |
| 2002/0018335 | A1* | 2/2002 | Koizumi | G06F 1/1632 361/679.47 |
| 2003/0214786 | A1* | 11/2003 | Niwatsukino | G06F 1/203 361/699 |
| 2004/0080909 | A1* | 4/2004 | Kitahara | G06F 1/1632 361/679.48 |
| 2004/0123604 | A1* | 7/2004 | Pokharna | G06F 1/1632 62/3.2 |
| 2005/0161197 | A1* | 7/2005 | Rapaich | G06F 1/1632 165/80.4 |
| 2017/0160773 | A1* | 6/2017 | Shibayama | G06F 1/1632 |

FOREIGN PATENT DOCUMENTS

| | | |
|---|---|---|
| JP | 2002-026554 A | 1/2002 |
| JP | 2002-182795 A | 6/2002 |
| JP | 2002-229680 A | 8/2002 |

\* cited by examiner

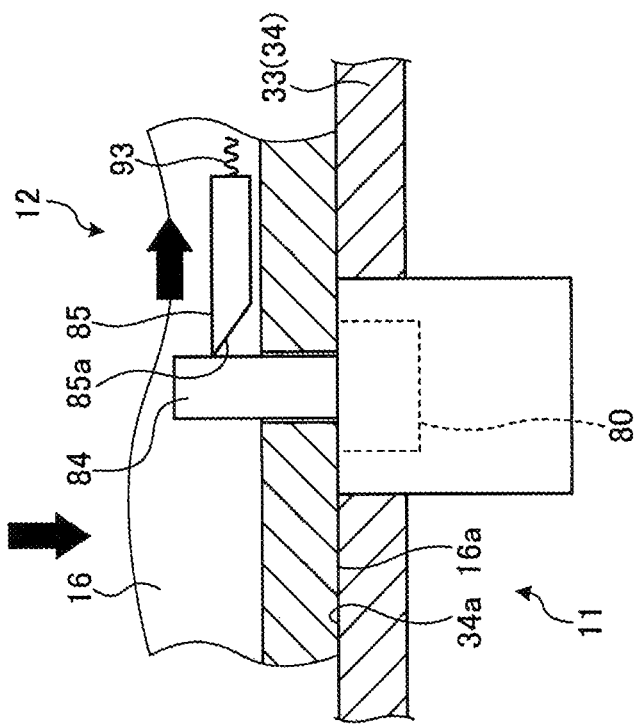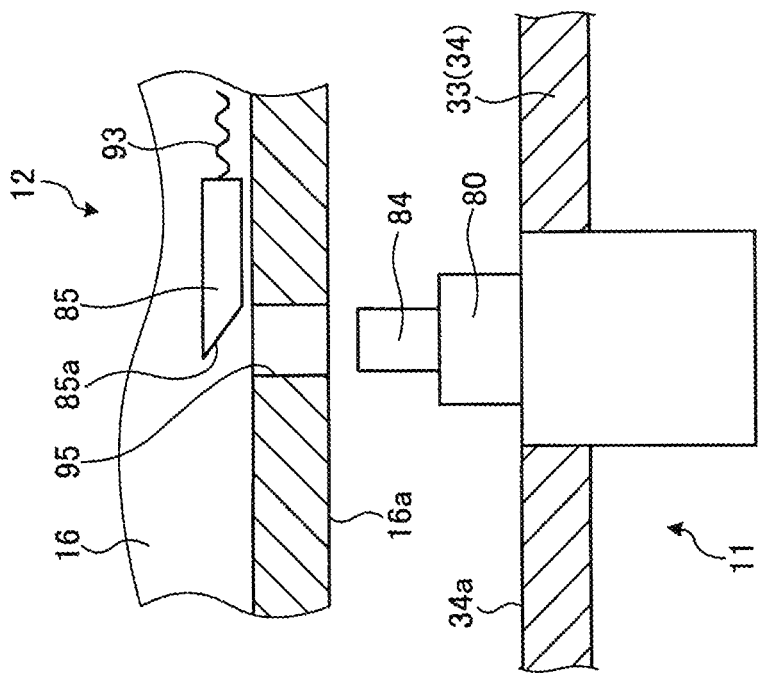
FIG. 7A
FIG. 7B

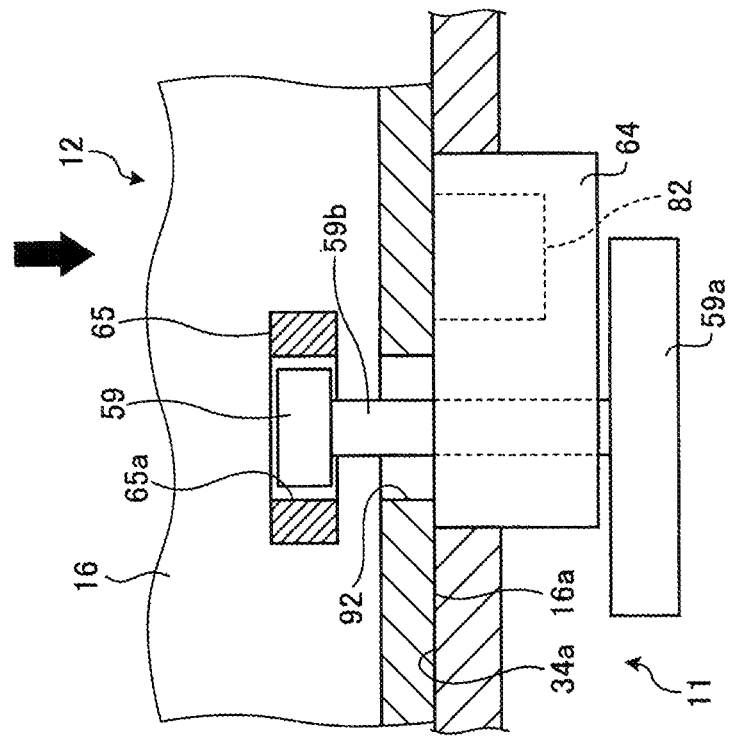
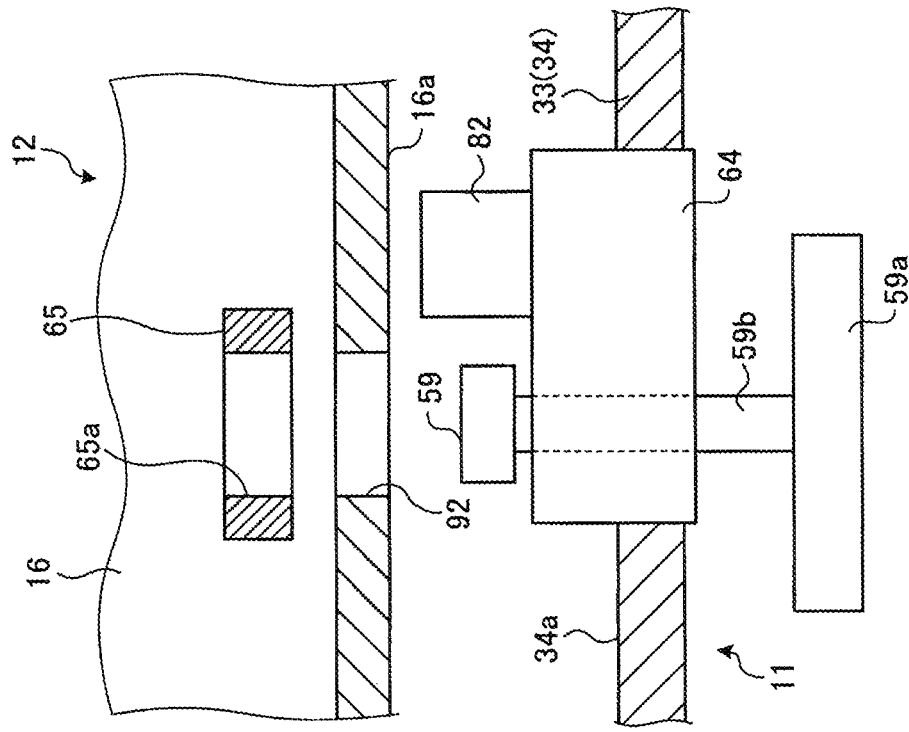
FIG. 8A
FIG. 8B

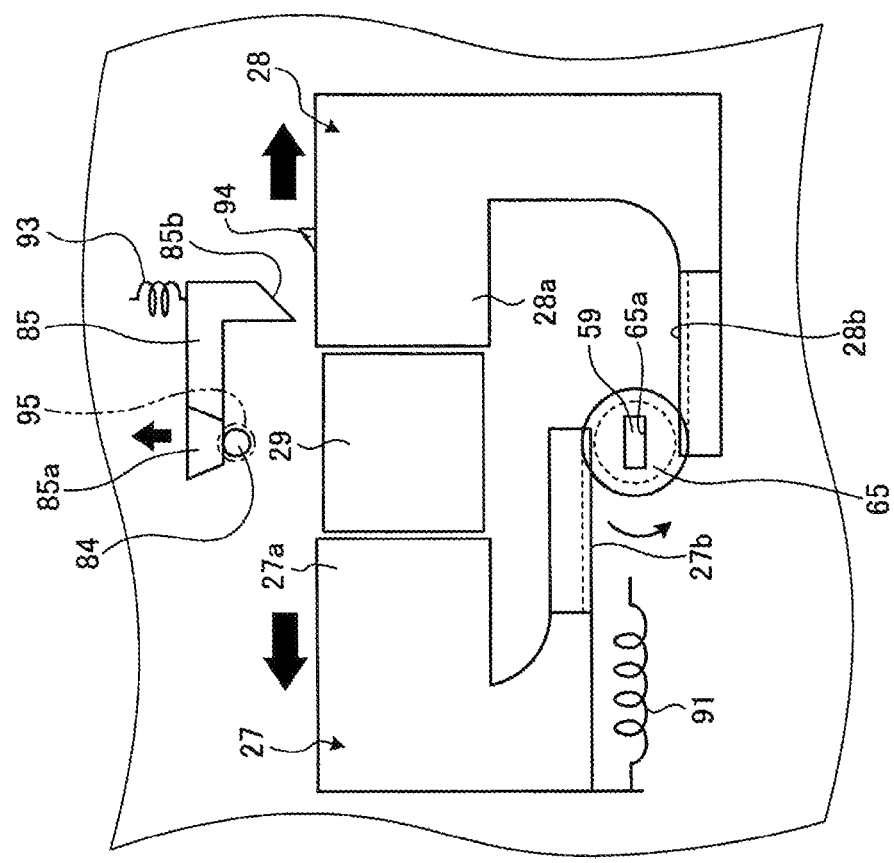
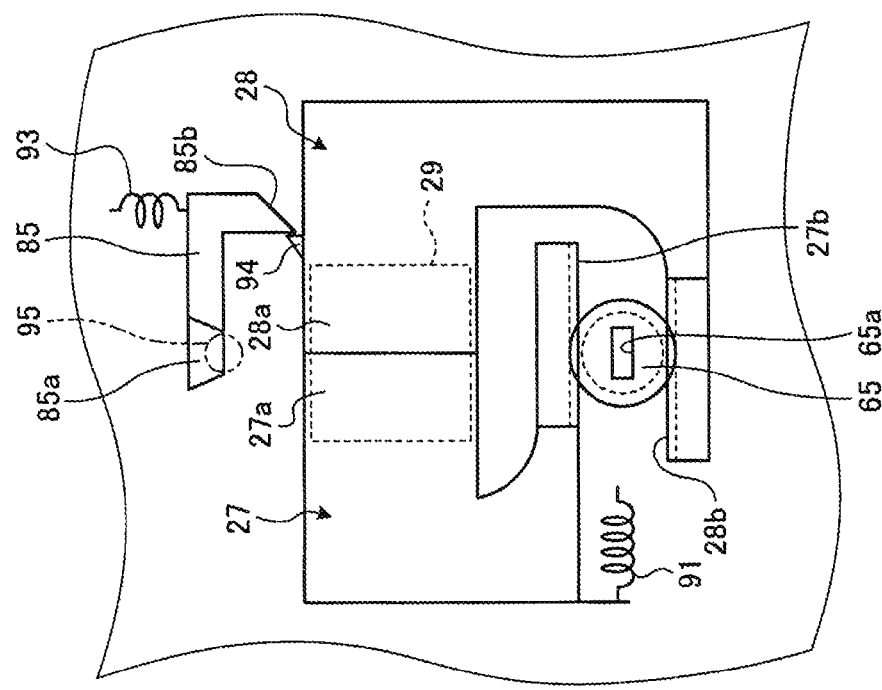

COOLING DEVICE FOR COOLING PORTABLE INFORMATION DEVICES

PRIORITY CLAIM

The present application claims benefit of priority under 35 U.S.C. §§ 120, 365 to the previously filed Japanese Patent Application No. JP2015-238260 with a priority date of Dec. 7, 2015, which is incorporated by reference herein.

TECHNICAL FIELD

The present invention relates to electronic apparatuses in general, and in particular to a cooling device for cooling a portable information device.

BACKGROUND

A portable information device having a lightweight and compact design in consideration of portability often has limited functions. For example, a notebook personal computer (laptop PC) typically has limited functions in order to reduce the weight. Thus, there are limitations in increasing the size and, performance of a cooling function of reducing heat generation from a processor or other devices mounted on a laptop PC and serving as an internal heating body of the laptop PC.

One solution is to provide a cooling device having a heat sink thermally connected to a heat sink exposed at the bottom surface of a laptop PC when the laptop PC is mounted on and connected to the cooling device in order to enhance a cooling function of the laptop PC. With this configuration, the laptop PC is provided with a cover having a mesh-like air vent in the bottom surface thereof serving as a mount surface to the cooling device, and the heat sink connected to a heating body is disposed inside the cover. The cooling device includes a heat sink in the shape of a pin support connected to the heat sink through the mesh-like air vent in the bottom surface of the laptop PC.

Basically, the heat sinks of the laptop PC and the cooling device have pin support shapes to increase a contact surface area therebetween in order to provide a sufficient heat transfer area. However, since the mesh-like cover member is provided at the bottom surface of the laptop PC, the cover member is interposed between the heat sinks of the laptop PC and the cooling device even when these heat sinks are connected to each other. This causes the problem of obtaining sufficient heat transfer efficiency. In addition, when the heat sink is exposed at the bottom surface of the laptop PC, external appearance degrades and the heat sink, which is a heating part, is exposed to the outside.

Consequently, it would be desirable to provide an improved cooling device for cooling a portable information device such as a laptop PC.

SUMMARY

In accordance with an embodiment of the present disclosure, a portable information device includes a heating body and a cooling device configured to absorb heat from the heating body. The portable information device also includes a heat-dissipation heat sink thermally connected to the heating body, an apparatus shutter member configured to cover the heat-dissipation heat sink so that the heat-dissipation heat sink is freely covered and uncovered, and a heat-receiving heat sink thermally connected to the heat-dissipation heat sink. The cooling device is detachably connected to the portable information device, and the cooling device includes a shutter driving mechanism that opens the apparatus shutter member when the portable information device is connected to the cooling device.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 7A is a side cross-sectional view illustrating a configuration of an on/off sensor when the portable information device is not mounted on a mount surface;

FIG. 7B is a side cross-sectional view illustrating a configuration of an on/off sensor when the portable information device is mounted on the mount surface;

FIG. 8A is a cross-sectional view illustrating configurations of an on sensor and an off sensor when the portable information device is not mounted on the mount surface;

FIG. 8B is a cross-sectional view illustrating configurations of an on sensor and an off sensor when the portable information device is mounted on the mount surface;

FIG. 9A is a bottom view illustrating an internal configuration of the portable information device when the apparatus shutter members are closed;

FIG. 9B is a bottom view illustrating an internal configuration of the portable information device when the apparatus shutter members are open;

DETAILED DESCRIPTION

Figure 1:
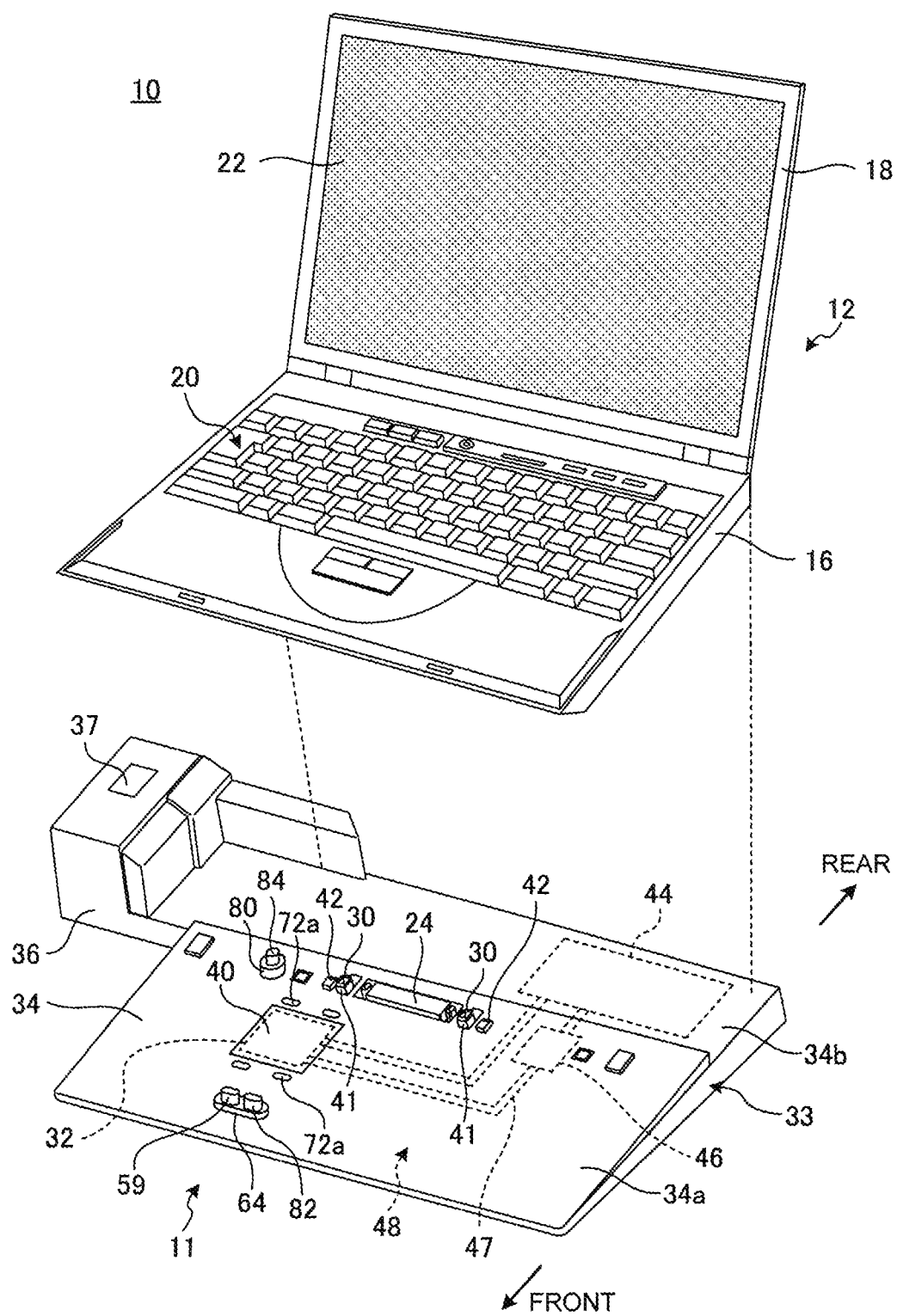
FIG. 1 illustrates an electronic apparatus according to an embodiment of the present invention.
Figure 2:
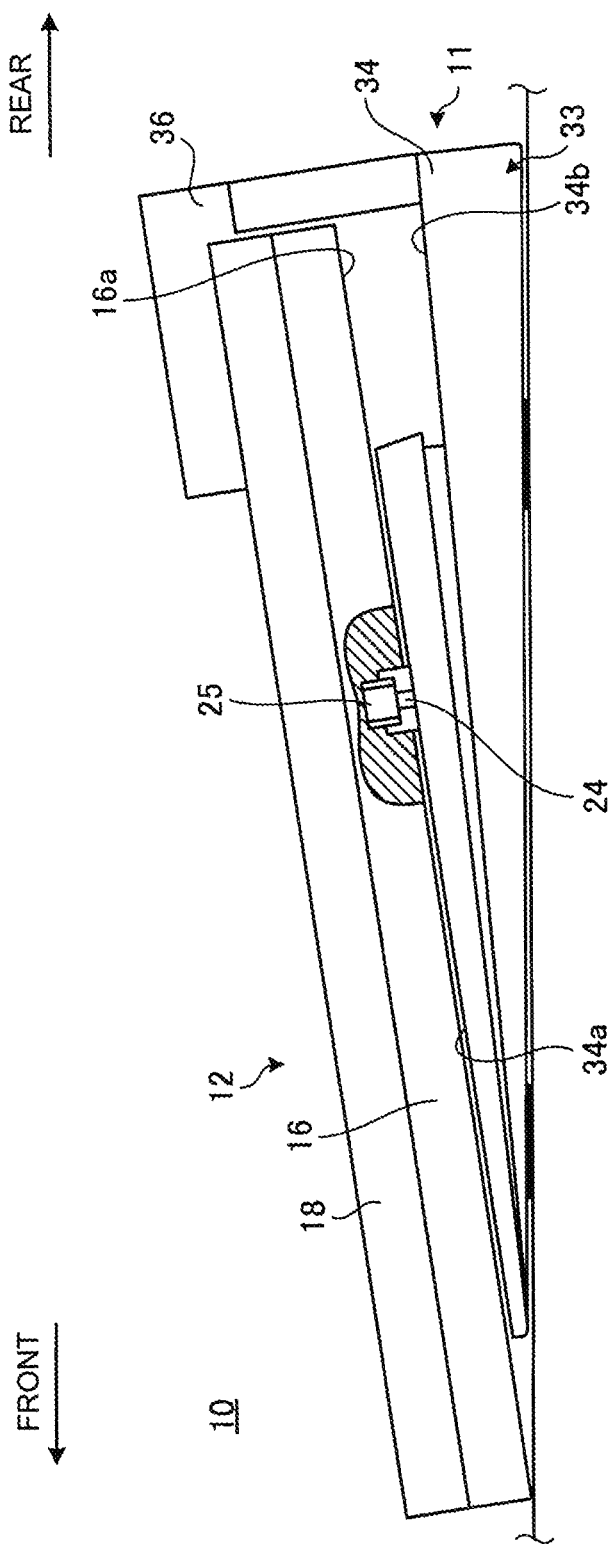
FIG. 2 is a partial cross-sectional side view illustrating a state in which the cooling device and a portable information device illustrated in FIG. 1 are connected to each other.
Figure 3:
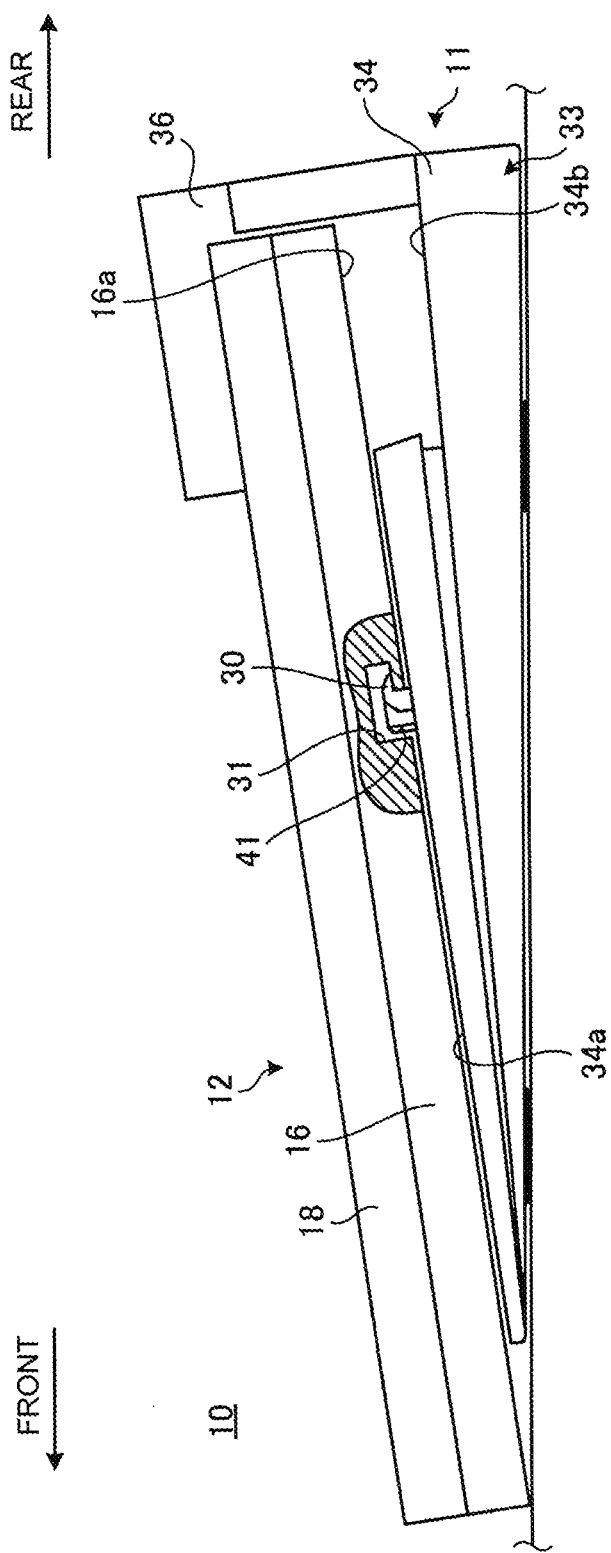
FIG. 3 is a partial cross-sectional side view illustrating a cross-section different from that illustrated in FIG. 2.
Figure 4:
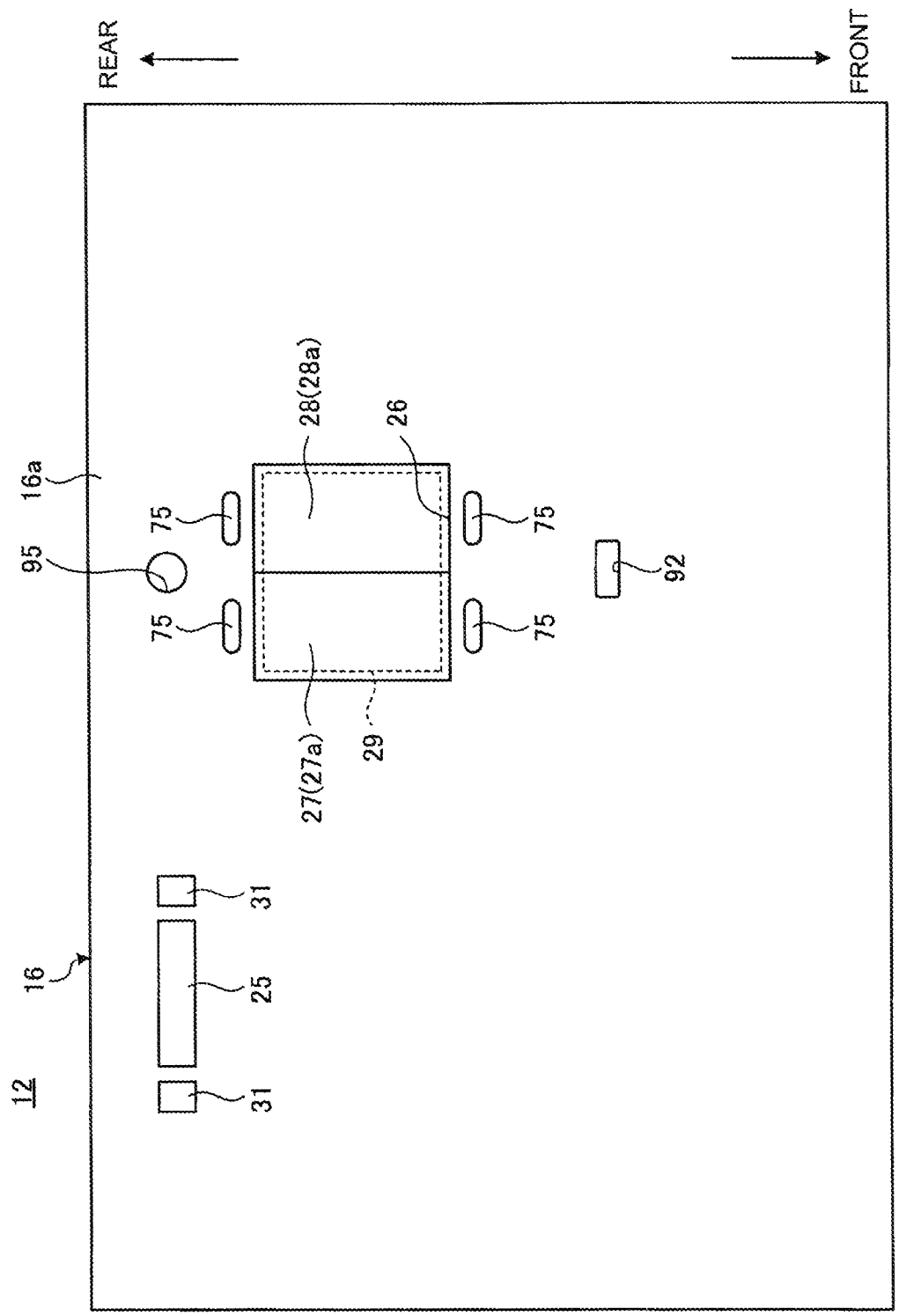
FIG. 4 is a bottom view illustrating a bottom surface of the portable information device illustrated in FIG. 1.

FIG. 1 is a perspective view of an electronic apparatus 10 according to an embodiment of the present invention in which a cooling device 11 and a portable information device 12 are separated from each other. FIG. 2 is a partial cross-sectional side view illustrating a state in which the cooling device 11 and the portable information device 12 illustrated in FIG. 1 are connected to each other. FIG. 3 is a partial cross-sectional side view illustrating a cross section different from that illustrated in FIG. 2. FIG. 4 is a bottom view illustrating a bottom surface 16a of the portable information device 12 illustrated in FIG. 1.

In the electronic apparatus 10 according to this embodiment, the portable information device 12 that is a laptop PC is mounted on and connected to the cooling device 11 that is an extension device so that the cooling function of the portable information device 12 can be enhanced and a processing function, a power supply function, and a connection function with respect to peripheral equipment and a network can be extended and enhanced. The portable information device 12 can be a device except a laptop PC, and may be a tablet personal computer (tablet PC) or a smartphone each having no physical keyboard.

First, an overall configuration of the electronic apparatus 10 will be described.

As illustrated in FIG. 1, the portable information device 12 is of a clamshell type in which a display chassis 18 is coupled to a body chassis 16 to be freely opened and closed. A keyboard 20 is disposed on the top surface of the body chassis 16, and a display 22 is provided on the front surface of the display chassis 18.

As illustrated in FIGS. 2 and 4, the bottom surface 16a of the body chassis 16 is provided with an apparatus connector 25 electrically connected to an extension connector 24 of the cooling device 11 and apparatus shutter members 27 and 28 covering an opening 26 formed in the bottom surface 16a to freely cover and uncover the opening 26. A heat-dissipation heat sink 29 is disposed in the opening 26 and covered with the apparatus shutter members 27 and 28 to be freely covered and uncovered. As illustrated in FIG. 3, the bottom surface 16a of the body chassis 16 has an engaging hole 31 configured to be engaged with an engaging lever 30 projecting from the cooling device 11. FIG. 2 illustrates a cross-sectional shape taken along a line passing through the connectors 24 and 25. FIG. 3 illustrates a cross-sectional shape taken along a line passing through the engaging lever 30 and the engaging hole 31.

The apparatus connector 25 is connected to an unillustrated board housed in the body chassis 16 of the portable information device 12. The heat-dissipation heat sink 29 is configured to extend a cooling function of the portable information device 12 when contacting the heat-receiving heat sink 32 of the cooling device 11. The heat-dissipation heat sink 29 and the heat-receiving heat sink 32 are thermally connected to each other so that heat generated in the portable information, device 12 is transferred to the cooling device 11 and dissipated to the outside. The apparatus shutter members 27 and 28 prevent the heat-dissipation heat sink 29 that becomes hot from being always exposed at the bottom surface 16a of the portable information device 12.

As illustrated in FIGS. 1-3, the cooling device 11 is used with the body chassis 16 of the portable information device 12 mounted on the cooling device 11, and includes a device chassis 33 made of a synthetic resin material or a metal material and provided with a PC mount part 34 and a locking operation part 36.

The PC mount part 34 has a box shape having a top surface that is large enough to allow the portable information device 12 to be mounted on the top surface of the PC mount part 34. The PC mount part 34 includes a mount surface 34a which is tilted to have its height gradually increase from the front to the rear and on which the bottom surface 16a of the portable information device 12 is placed and a refuge surface 34b that is recessed at the rear of the mount surface 34a. The refuge surface 34b is a lower portion for avoiding an unillustrated battery or another object that possibly projects from a rear lower surface of the portable information device 12.

The locking operation part 36 is a rectangular solid part whose height is larger than that of the PC mount part 34, and is disposed at a side and the rear of the PC mount part 34 (at a side of the refuge surface 34b). The locking operation part 36 includes the ejecting button 37 and an unillustrated key insertion hole. The ejecting button 37 is an operating button that is operated when the portable information device 12 mounted on and connected to the cooling device 11 is detached. The key insertion hole is a hole for inserting a wired locking key (not shown) for the portable information device 12. When the locking key is inserted into the key insertion hole to perform locking, an input operation to the ejecting button 37 becomes invalid. In this manner, detachment of the portable information device 12 from the cooling device 11 is avoided to prevent theft of the portable information device 12.

On the mount surface 34a, disposed are the extension connector 24 and a device shutter member 40 covering an opening 38 (see FIG. 6) formed in the mount surface 34a so that the opening 38 is freely covered and uncovered. The heat-receiving heat sink 32 is disposed in the opening 38 and covered with the device shutter member 40 to be freely covered and uncovered.

The extension connector 24 is connected to, for example, an unillustrated board housed in the PC mount part 34, and projects from the mount surface 34a. The extension connector 24 constitutes a connection terminal of each extension function provided in the cooling device 11, and is connected to the apparatus connector 25 provided on the bottom surface 16a of the portable information device 12. Connection of the apparatus connector 25 to the extension connector 24 electrically connects the cooling device 11 and the portable information device 12 so that the extension functions provided in the cooling device 11 can be used by using the portable information device 12.

The engaging lever 30 projects from each of the left and right sides of the extension connector 24, and has its top exposed at the mount surface 34a. A guide post 41 having a U shape in plan projects to surround three sides: front, left, and right, of each engaging lever 30. In connecting the portable information device 12 to the cooling device 11, the guide post 41 is inserted together with the engaging lever 30 into the engaging hole 31 of the portable information device 12, and thus, serves as a positioning pin for positioning the portable information device 12 relative to the device chassis 33. An ejecting member 42 is provided at a side of each guide post 41 on the mount surface 34a. In detaching the portable information device 12 from, the cooling device 11, the ejecting member 42 elevates after disengagement of the engaging lever 30 from the engaging hole 31, and then lifts the bottom surface 16a of the portable information device 12.

A cooling structure of the electronic apparatus 10 will now be described. m First, a cooling structure of the cooling device 11 is described.

Figure 5:
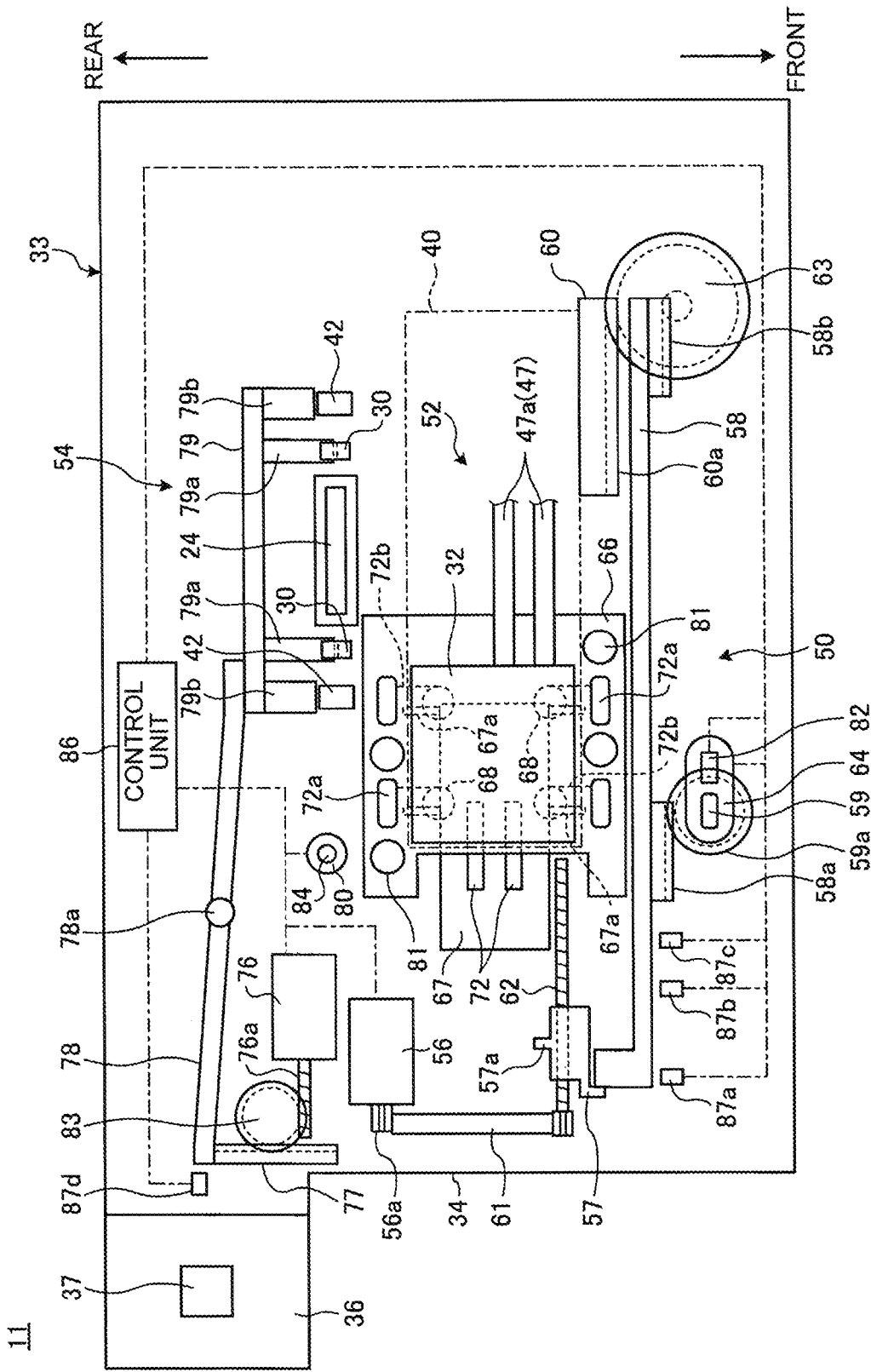
FIG. 5 is a plan view illustrating an internal configuration of the cooling device.
Figure 6:
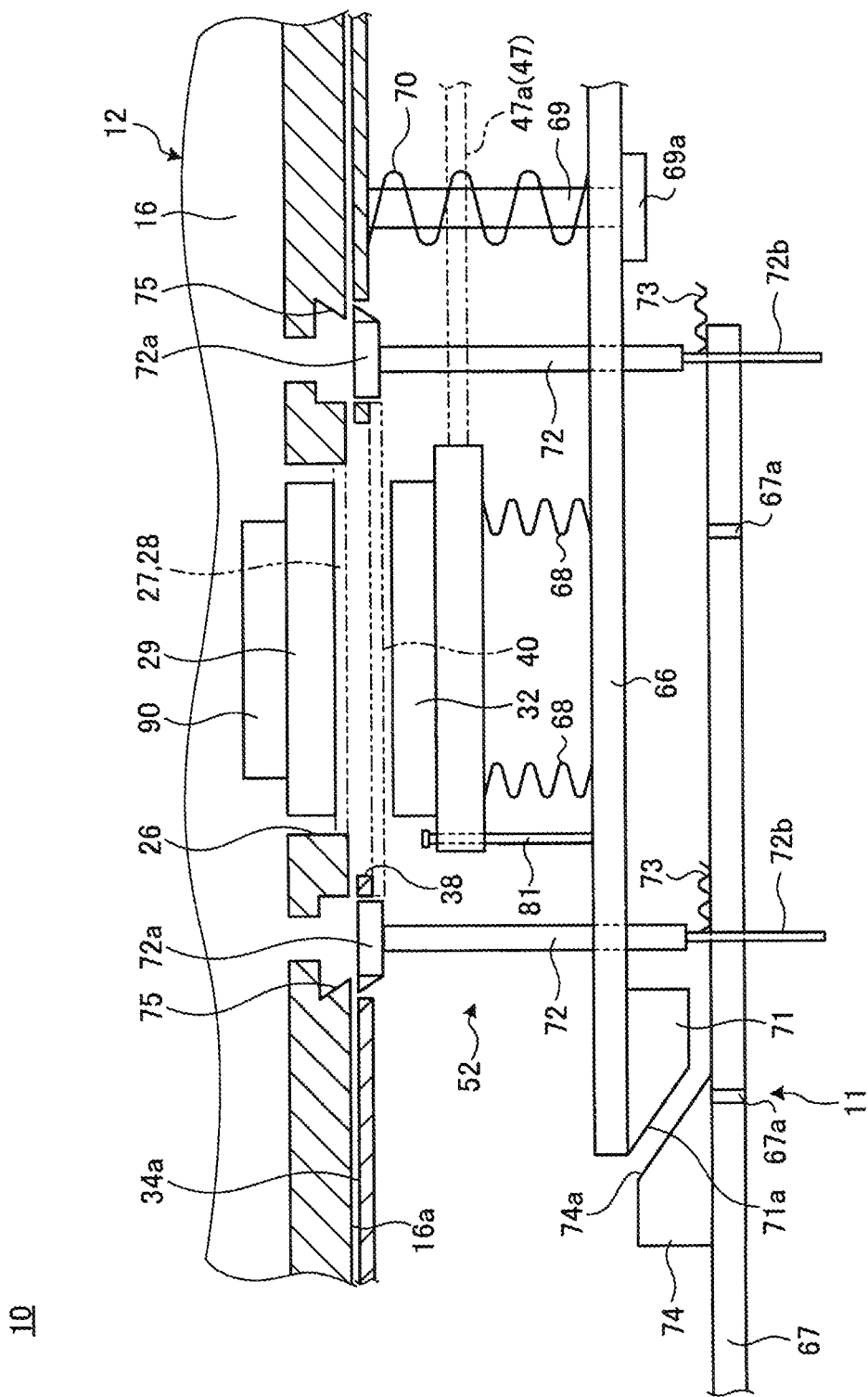
FIG. 6 is an enlarged side view illustrating a main portion of the internal configuration of the cooling device.

FIG. 5 is a plan view illustrating an internal configuration of the cooling device 11. FIG. 6 is an enlarged side view illustrating a main portion of the internal configuration of the cooling device 11.

As illustrated in FIG. 1, the cooling, device 11 includes a water cooling unit 48 in which a radiator 44, a heat-receiving heat sink 32, and a circulating pump 46 are connected to one another in a loop by pipes 47 so that cooling water circulates.

The heat-receiving heat sink 32 is a stepped rectangular plate member made of a metal material having a high thermal conductivity, such as copper or aluminum. The heat-receiving heat sink 32 is connected to an inlet pipe 47 and an outlet pipe 47, and cooling water is distributed in cooling water distribution space in which unillustrated fins are disposed. This cooling water distribution space is defined at the inner side of a thin lid body constituting an upper surface of the heat-receiving heat sink 32. The fins are arranged in parallel with predetermined intervals in the cooling, water distribution space with end faces of the fins being in contact with the inner surface of the lid body. In this manner, the heat-receiving heat sink 32 has a water cooling jacket structure that exchanges heat between the fins and cooling water by distribution of the cooling water around the fins in the cooling water distribution space. In the water cooling unit 48 having such a structure, cooling water that has also dissipated heat with air supply by an unillustrated fan in the radiator 44 is introduced into the heat-receiving heat sink 32 through the circulating pump 46. Cooling water that has collected heat of the heat-dissipation heat sink 29 in the heat-receiving heat sink 32 is introduced into the radiator 44 again. In this manner, the heat-receiving heat sink 32 can cool the heat-dissipation heat sink 29 with a high cooling efficiency.

As illustrated in FIGS. 5-6, the cooling device 11 includes, in the device chassis 33, a shutter driving mechanism 50, an up-and-down mechanism 52, and an apparatus ejecting mechanism 54.

The shutter driving mechanism 50 is a mechanism part that drives opening and closing of the apparatus shutter members 27 and 28 and the device shutter member 40. As illustrated in FIG. 5, the shutter driving mechanism 50 includes a first motor 56, a slide link 57, a slide member 58, an apparatus shutter operating member 59, and a device shutter operating member 60.

The first motor 56 is an electric motor having an output shaft 56a coupled to a ball screw mechanism 62 through a gear mechanism 61. The ball screw mechanism 62 extends laterally, and the slide link 57 is externally fitted to the ball screw mechanism 62. When a driving force is transmitted from the first motor 56 to the ball screw mechanism 62 through the output shaft 56a and the gear mechanism 61, the ball screw mechanism 62 is driven to rotate so that the slide link 57 moves laterally.

The slide link 57 is a block member that is movable laterally along the ball screw mechanism 62. A pressing part 57a projects from a rear side surface of the slide link 57. A front side surface of the slide link 57 is coupled to an end of the slide member 58.

The slide member 58 is a rod member that extends laterally, and is slidable laterally on the inner surface of the device chassis 33. The slide member 58 is provided with a first rack gear 58a disposed close to an end of the slide member 58 and a second rack gear 58b disposed close to the other end of the slide member 58, relative to the center of the slide member 58 in the longitudinal direction. The first rack gear 58a is engaged with a first pinion gear 59a provided integrally and coaxially with the apparatus shutter operating member 59 at an initial position (unattached state) illustrated in FIG. 5. The second rack gear 58b is engaged with a second pinion gear 63 at the initial position illustrated in FIG. 5. The second pinion gear 63 is engaged with an opening/closing rack gear 60a provided in the device shutter operating member 60.

The apparatus shutter operating member 59 is a short rod member rotatably and pivotally supported on an on sensor (detection unit) 64 described later. As illustrated in FIGS. 1, 8A, and 8B, the apparatus shutter operating member 59 projects from an upper surface of the on sensor 64 that projects from the mount surface 34a. The apparatus shutter operating member 59 is rotatably and pivotally supported on the on sensor 64 to be movable relative to the on sensor 64 in an axial direction. The first pinion gear 59a is disposed at a lower end of a shaft part 59b of the apparatus shutter operating member 59 and is provided integrally and coaxially with the shaft part 59b. When the slide member 58 moves laterally, the first pinion gear 59a rotates about the shaft part 59b with the first rack gear 58a interposed therebetween. In this manner, the apparatus shutter operating member 59 also rotates about the shaft part 59b to rotate an opening/closing gear (opening/closing member) 65 (see FIG. 9) described later of the portable information device 12 so that the apparatus shutter members 27 and 28 move laterally to be open or closed.

The device shutter operating member 60 is coupled to a side of the device shutter member 40. When the slide member 58 moves laterally, the second pinion gear 63 is caused to rotate through the second rack gear 58b. In this manner, the device shutter operating member 60 is caused to move laterally through the opening/closing rack gear 60a so that the device shutter member 40 laterally moves to be open or closed.

The up-and-down mechanism 52 is a mechanism part that drives the heat-receiving heat sink 32 to move up and down. As illustrated in FIGS. 5 and 6, the up-and-down mechanism 52 includes the first motor 56 shared by the shutter driving mechanism 50, a base plate 66, and an up-and-down slide member 67.

The base plate 66 is a plate member whose outer shape is larger than that of the heat-receiving heat sink 32 in plan. The base plate 66 elastically supports the heat-receiving heat sink 32 through a set of coil springs (elastic bodies) 68 disposed on an upper surface of the base plate 66. The base plate 66 is hung on a lower surface opposite to the mount surface 34a serving as an upper surface of the device chassis 33. Specifically, support bars 69 hung on the lower surface opposite to the mount surface 34a penetrate the base plate 66 in the thickness direction, and are retained by large-diameter parts 69a at the lower ends of the support bars 69 to stop disconnection. Coil springs 70 are externally fitted to the support bars 69. The base plate 66 is always biased downward by the coil springs 70 to be pressed against the large-diameter part 69a, thereby preventing a backlash in, for example, carrying the cooling device 11.

Ribbed pressure-receiving members 71 each having a slope 71a that tilts upward toward the up-and-down slide member 67 (to the left in FIGS. 5 and 6) are provided on a lower surface of the base plate 66. A set of (e.g., four) retention pins 81 stand on an upper surface on the base plate 66. The retention pins 81 restrict the range of upward movement of the heat-receiving heat sink 32 elastically supported on, the base plate 66, and prevent a backlash.

A set of (e.g., four) attraction shaft members 72 each including an external screw member 72a at the upper end projecting from the upper surface of the base plate 66 and a pressure-receiving plate 72b at the lower end projecting outward from a lower surface of the base plate 66 are pivotally supported on the base plate 66 so that the vertical positions of the attraction shaft members 72 are fixed. The attraction shaft members 72 are biased by the coil springs 73 to a rotation direction in which the external screw members 72a and the pressure-receiving plates 72b always rotate clockwise in FIG. 5. The external screw members 72a are disposed to project from the mount surface 34a. When the portable information device 12 is mounted on the cooling device 11 and the base plate 66 elevates, the external screw members 72a are engaged with the internal screw holes 75 formed in the bottom surface 16a of the portable information device 12 (see FIG. 6). The internal screw holes 75 are holes in which spiral internal screws are formed.

The up-and-down slide member 67 is a plate member that extends laterally, and is slidable laterally on the inner surface of the device chassis 33. The up-and-down slide member 67 slides under the lower surface of the base plate 66, and is always biased to the left by a biasing force of an unillustrated elastic body so that the up-and-down slide member 67 is at the initial position illustrated in FIG. 5. Ribbed lift members 74 each having a slope 74a that tilts downward toward the base plate 66 are provided on an upper surface of the up-and-down slide member 67. Each of the slopes 74a of the lift members 74 is opposed to a corresponding one of the slopes 71a of the pressure-receiving members 71 on the lower surface of the base plate 66 at the initial position (unattached position) illustrated in FIGS. 5 and 6. A set of pressing plates 67a capable of pressing the pressure-receiving plates 72b of the attraction shaft members 72 when the up-and-down slide member 67 moves forward are provided in side portions of the up-and-down slide member 67.

The apparatus ejecting mechanism 54 is a mechanism part that drives the engaging levers 30 and the ejecting members 42 in detaching the portable information device 12 mounted on and connected to the cooling device 11. As illustrated in FIG. 5, the apparatus ejecting mechanism 54 includes a second motor 76, an ejecting rack gear 77, a seesaw arm 78, and an ejecting slide member 79.

The second motor 76 is an electric motor including a worm gear 76a that serves as an output shaft of the second motor 76 and is connected to the ejecting rack gear 77 through a worm wheel 83. The ejecting rack gear 77 is movable in a front-rear direction on the inner surface of the device chassis 33, and is driven by the worm wheel 83 to follow the worm wheel 83.

The seesaw arm 78 is a long arm member extending laterally, and is movable in a seesaw manner around a seesaw shaft 78a disposed at substantially the middle of the seesaw arm 78. The seesaw arm 78 has an end coupled to an end of the ejecting rack gear 77. The seesaw arm 78 seesaws clockwise in FIG. 5 when the ejecting rack gear 77 moves rearward, and seesaws counterclockwise in FIG. 5 when the ejecting rack gear 77 moves forward. The other end of the seesaw arm 78 is coupled to the ejecting slide member 79.

The ejecting slide member 79 moves in the front-rear direction in accordance with seesaw movement of the seesaw arm 78. The ejecting slide member 79 includes disengaging parts 79a that move and disengage the engaging levers 30 and lift parts 79b that lift the ejecting members 42 by a pressing function of unillustrated slopes. The ejecting slide member 79 moves forward when the seesaw arm 78 seesaws clockwise. At this time, the engaging levers 30 engaged with the engaging holes 31 are moved by the disengaging parts 79a to be disengaged, and then the ejecting members 42 are lifted by the lift parts 79b so that the bottom surface 16a of the portable information device 12 is lifted and the portable information device 12 is popped up on the mount surface 34a.

As illustrated in FIG. 1, the on/off sensor 80 and the on sensor 64 as detection units for detecting mounting of the portable information device 12 and the on/off sensor 80 and the off sensor 82 as detection units for detecting detachment of the portable information device 12 are provided on the mount, surface 34a of the cooling device 11.

FIGS. 7A-7B are side cross-sectional views schematically illustrating a configuration of the on/off sensor 80. Specifically, FIG. 7A illustrates a state in which the portable information device 12 is not mounted on the mount surface 34a, and FIG. 7B illustrates a state in which the portable information device 12 is mounted on the mount surface 34a. FIGS. 8A and 8B are side cross-sectional views schematically illustrating configurations of the on sensor 64 and the off sensor 82. Specifically, FIG. 8A illustrates a state in which the portable information device 12 is not mounted on the mount surface 34a, and FIG. 8B illustrates a state in which the portable information device 12 is mounted on the mount surface 34a.

As illustrated in FIGS. 1 and 7A-7B, the on/off sensor 80 is a cylindrical member elastically supported on the mount surface 34a and projects upward from the mount surface 34a. The on/off sensor 80 is pressed to transmit a predetermined detection signal (on signal) when the portable information device 12 is mounted on the mount surface 34a, and returns to an original lifted position to transmit a predetermined detection signal (off signal) when the portable information device 12 is lifted from the mount surface 34a.

An unlocking pin (unlocking unit) 84 is coaxially disposed in the inner cylinder of the on/off sensor 80. Although specifically described later, the unlocking pin 84 is a member for unlocking a locking member (locking unit) 85 (see FIG. 9) that locks the apparatus shutter members 27 and 28 of the portable information device 12 to closed positions.

As illustrated in FIGS. 1 and 8A-8B, the on sensor 64 is an elliptic cylindrical member that is elastically supported on the mount surface 34a and projects upward, from the mount surface 34a. The on sensor 64 is pressed to transmit a predetermined detection signal (on signal) when the portable information device 12 is mounted on the mount surface 34a.

The off sensor 82 is a cylindrical member that is elastically supported on the on sensor 64 and projects from the upper surface of the on sensor 64. The off sensor 82 projects above the on sensor 64, and detects whether the bottom surface 16a of the portable information device 12 is located or not at a position higher than the on sensor 64. The off sensor 82 is pressed and buried in the on sensor 64 when the portable information device 12 is mounted on the mount surface 34a, and returns to an original lifted position to transmit a predetermined detection signal (off signal) when the portable information device 12 is lifted from the mount surface 34a.

As illustrated in FIG. 5, the on/off sensor 80, the on sensor 64, and the off sensor 82 are connected to a control unit 86 disposed in the device chassis 33 through signal lines indicated by dot-dash lines in FIG. 5. When receiving the on and off signals from the on/off sensor 80, the on sensor 64, and the off sensor 82, the control unit 86 suitably controls driving of the first motor 56 and the second motor 76 to cause the shutter driving mechanism 50, the up-and-down mechanism 52, the apparatus ejecting mechanism 54 to operate as appropriate.

In addition, in the device chassis 33, there provided a group of position detecting sensors 87a to 87c for detecting a position of the slide member 58 and a position detecting sensor 87d for detecting a position of the ejecting rack gear 77. The position detecting sensors 87a to 87c are arranged along a forward direction (to the right in FIG. 5) of the slide member 58, and detects a slide position of an end of the slide member 58 coupled to the slide link 57 to transmit a predetermined position signal. The position detecting sensor 87d detects rearward movement of the ejecting rack gear 77 to a predetermined position, and transmits a predetermined position signal. The position signals from the position detecting sensors 87a to 87d are transmitted to the control, unit 86, and are used for drive control of the first motor 56 and the second motor 76.

A cooling structure of the portable information device 12 will now be described.

FIGS. 9A-9B are bottom views schematically illustrating an internal configuration of the portable information device 12. Specifically, FIG. 9A illustrates a state in which the apparatus shutter members 27 and 28 are closed, and FIG. 9B illustrates a state in which the apparatus shutter members 27 and 28 are open.

As illustrated in FIGS. 4 and 9A-9B, the portable information device 12 includes the heat-dissipation heat sink 29 in the opening 26 formed in the bottom surface 16a so that the opening 26 provided with the heat-dissipation heat sink 29 can be freely covered and uncovered with the apparatus shutter members 27 and 28.

The heat-dissipation heat sink 29 is a rectangular plate member made of a metal material having a high thermal conductivity, such as copper or aluminum. As illustrated in FIG. 6, the heat-dissipation heat sink 29 is thermally connected to a heating body 90 that is an electronic component, such as a CPU or a GPU, provided in the body chassis 16. With this configuration, heat generated in the heating body 90 is efficiently transferred to the heat-dissipation heat sink 29.

As illustrated in FIGS. 9A-9B, one apparatus shutter member 27 covers and uncovers approximately a half of the heat-dissipation heat sink 29, whereas the other apparatus shutter member 28 covers and uncovers the other approximately half of the heat-dissipation heat sink 29. The apparatus shutter member 27 is a U-shaped plate member including a shutter part 27a for covering approximately a half of the heat-dissipation heat sink 29 and a rack gear part 27b bent from the shutter part 27a in a U shape. The other apparatus shutter member 28 is a U-shaped plate member including a shutter part 28a for covering the other approximately half of the heat-dissipation heat sink 29 and a rack gear part 28b bent from the shutter part 28a in a U shape larger than the U shape of the apparatus shutter member 27.

The apparatus shutter members 27 and 28 are slidable in opposite directions laterally on the inner surface of the body chassis 16. At this time, at least the apparatus shutter member 27 is biased by a coil spring 91 to the closed direction in which the shutter part 27a approaches the shutter part 28a. The rack gear parts 27b and 28b of the apparatus shutter members 27 and 28 are engaged with the opening/closing gear 65.

Thus, when the opening/closing gear 65 rotates counterclockwise in FIG. 9A, the apparatus shutter members 27 and 28 slide in open directions in which the shutter parts 27a and 28a of the apparatus shutter members 27 and 28 move away from each other, against a biasing force of the coil spring 91. Consequently, the heat-dissipation heat sink 29 is exposed at the bottom surface 16a (see FIG. 9B). On the other hand, when a driving force (retaining force) to the opening/closing gear 65 is canceled from a state in which the apparatus shutter members 27 and 28 are open as illustrated in FIG. 9B, the apparatus shutter member 27 is caused to move in the closed direction by a biasing force of the coil spring 91. At the same time, the apparatus shutter member 28 is caused to move in the closed direction by a driving force from the apparatus shutter member 27 that moves in the closed direction, through the opening/closing gear 65. Consequently, the heat-dissipation heat sink 29 is covered with the apparatus shutter members 27 and 28 (see FIG. 9A).

An engaging hole 65a with which the apparatus shutter operating member 59 projecting from the mount surface 34a of the cooling device 11 is formed at the center of the opening/closing gear 65. When the portable information device 12 is mounted on the cooling device 11, the apparatus shutter operating member 59 is engaged with the engaging hole 65a (see FIG. 8B) through an aperture 92 (see FIG. 4) formed in the bottom surface 16a. When the apparatus shutter operating member 59 rotates, the opening/closing gear 65 rotates accordingly, and the apparatus shutter members 27 and 28 at the closed positions become open.

The locking member 85 is disposed at the rear of the apparatus shutter members 27 and 28 to be slidable in the front-rear direction. The locking member 85 is a plate member having a substantially L shape in plan, and is always biased by a coil spring 93 forward (toward the apparatus shutter members 27 and 28). The locking member 85 includes a slope 85a that is located at an end of the locking member 85 and declines forward and a restriction part 85b that is located at the other end of the locking member 85 and has a right triangle shape. A restriction projection 94 having a right triangle shape projects from a portion of a side surface of the apparatus shutter member 28 near the shutter part 28a.

In a state in which the portable information device 12 is not mounted on the cooling device 11 and the apparatus shutter members 27 and 28 are at the closed positions illustrated in FIG. 9A, the restriction projection 94 is stopped, by the restriction part 85b of the locking member 85 that is caused to move forward by a biasing force of the coil spring 93. Consequently, movements in the open direction of the apparatus shutter member 28 and the apparatus shutter member 27 that moves in conjunction with the apparatus shutter member 28 through the opening/closing gear 65 are restricted, and the apparatus shutter members 27 and 28 are locked at the closed positions.

When the portable information device 12 in this locked state is mounted on the cooling device 11 and the unlocking pin 84 of the cooling device 11 is inserted in the aperture 95 formed in the bottom surface 16a, the tip of the unlocking pin 84 presses the slope 85a of the locking member 85 (see FIG. 7). In this manner, the locking member 85 moves rearward against the biasing force of the coil spring 93 so that the stopping of the restriction projection 94 by the restriction part 85b (see FIG. 9B) is canceled. Consequently, the apparatus shutter member 28 and the apparatus shutter member 27 that moves in conjunction with the apparatus shutter member 28 through the opening/closing gear 65 are unlocked so that movement in the open direction is allowed.

An operation of the cooling structure of the electronic apparatus 10 will now be described.

First, in a state where the portable information device 12 is not attached to the cooling device 11, the heat-dissipation heat sink 29 is covered with the apparatus shutter members 27 and 28 (see FIG. 9A), and the heat-receiving heat sink 32 is covered with the device shutter member 40 (see FIG. 5). Thus, a user does not erroneously touch any of the heat-dissipation heat sink 29 and the heat-receiving heat sink 32, and quality of external appearances of the bottom surface 16a and the mount surface 34a can be sufficiently obtained.

At this time, the apparatus shutter members 27 and 28 of the portable information device 12 are locked by the locking member 85. Thus, in using the portable information device 12 alone, the user does not erroneously open the apparatus shutter members 27 and 28 with, for example, a finger, and exposure of the hot heat-dissipation heat sink 29 at the bottom surface 16*a* is prevented.

Next, in attaching the portable information device 12 to the cooling device 11 from the state described above, as illustrated in FIGS. 2 and 3, the extension connector 24 is connected to the apparatus connector 25, while the engaging levers 30 and the guide posts 41 are inserted into the engaging holes 31 formed in the bottom surface 16*a* of the portable information device 12. In this manner, the extension connector 24 is electrically connected to the apparatus connector 25 and the engaging levers 30 are engaged with the engaging holes 31, thereby preventing detachment of the portable information device 12 from the cooling device 11.

In this attachment, the on/off sensor 80 and the on sensor 64 are pressed by the bottom surface 16*a* of the portable information device 12 mounted on the mount surface 34*a* (see FIGS. 71 and 8B). Consequently, the on/off sensor 80 and the on sensor 64 transmit on signals to the control unit 86. Upon receiving the two on signals, the control unit 86 turns the cooling device 11 on. As described above, the cooling device 11 has a configuration in which the on/off sensor 80 and the on sensor 64 are disposed to be separated from each other in the front-rear direction on the mount surface 34*a* and when both of the sensors 64 and 80 transmit on signals, the cooling device 11 is turned on. Thus, since two on signals are not transmitted unless the portable information device 12 is adequately mounted on the mount surface 34*a*, it is possible to prevent turn-on of the cooling device 11 with an inadequately tilt state of the portable information device 12, for example.

When the on/off sensor 80 is pressed, the unlocking pin 84 penetrates the aperture 95 in the bottom surface 16*a* of the portable information device 12 to move the locking member 85 in an unlocking direction, and thus, the apparatus shutter members 27 and 28 are unlocked (see FIGS. 7B and 9B). At the same time, the apparatus shutter operating member 59 penetrates the aperture 92 in the bottom surface 16*a* of the portable information device 12 to be engaged with the engaging hole 65*a* of the opening/closing gear 65 (see FIG. 8B).

Figure 10:
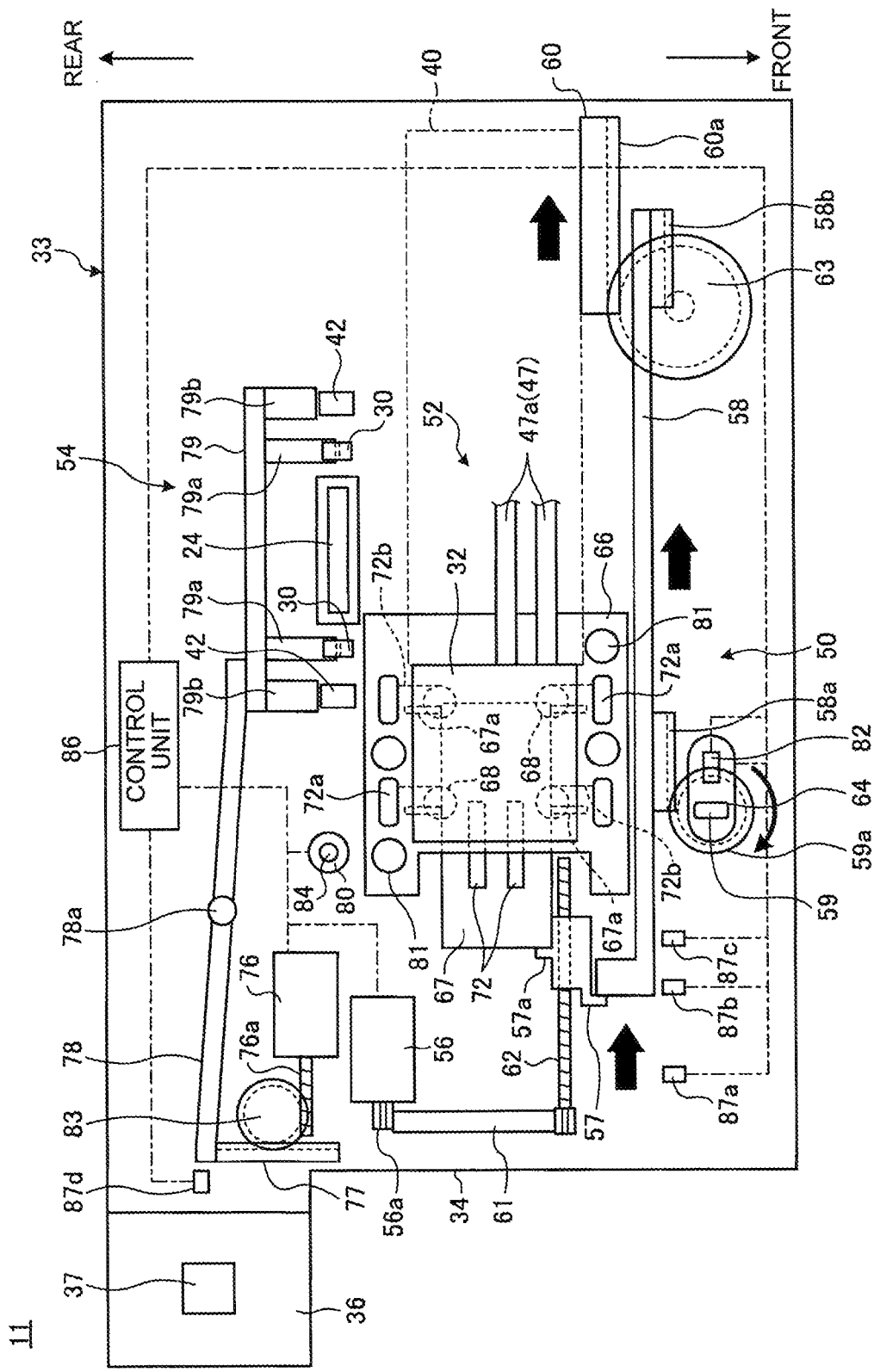
FIG. 10 is a plan view illustrating a state in which a slide member moves forward from the state illustrated in FIG. 5 so that the device shutter member is open.

When the cooling device 11 is turned on, the shutter driving mechanism 50 is first opened, and then, the apparatus shutter members 27 and 28 and the device shutter member 40 are opened. That is, first, the first motor 56 is driven to rotate, and as illustrated in FIG. 10, the slide link 57 moves forward from the initial position illustrated in FIG. 5 to the right, and the slide member 58 also moves forward. Accordingly, the first pinion gear 59*a* is caused to rotate by the first rack gear 58*a* that is moving forward to follow the first rack gear 58*a*, and rotation of the apparatus shutter operating member 59 causes the opening/closing gear 65 of the portable information device 12 to rotate (see FIG. 10). Consequently, the apparatus shutter members 27 and 28 are opened so that the heat-dissipation heat sink 29 is exposed at the bottom surface 16*a* of the portable information device 12 (see FIG. 9B). At the same time, the second pinion gear 63 is caused to rotate by the second rack gear 58*b* that is moving forward to follow the second rack gear 58*b*, and the device shutter operating member 60 is caused to move forward through the opening/closing rack gear 60*a* (see FIG. 10). Consequently, the device shutter member 40 is opened so that the heat-receiving heat sink 32 is exposed at the mount surface 34*a* of the cooling device 11.

Figure 11:
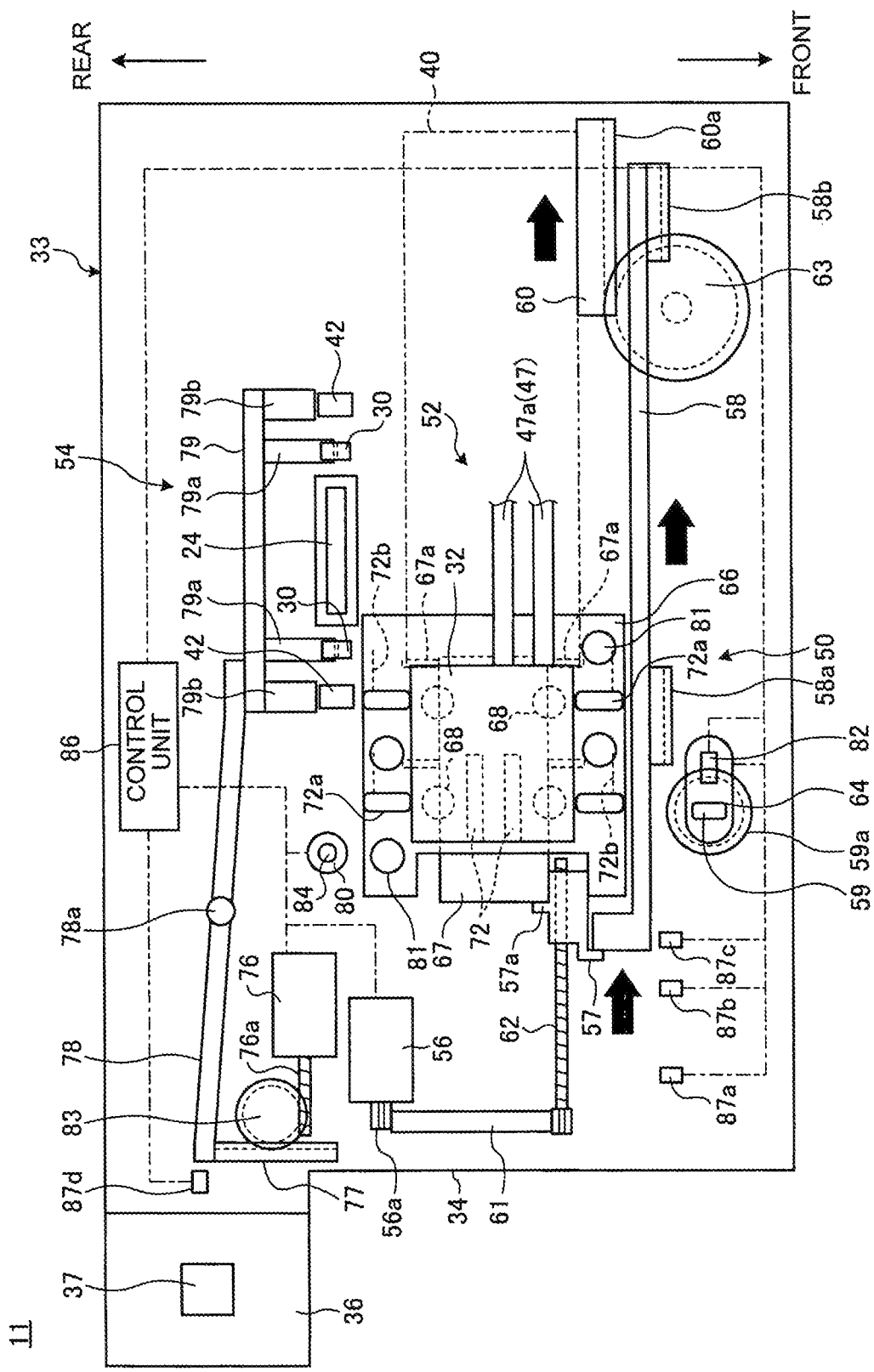
FIG. 11 is a plan view illustrating a state in which an up-and-down slide member moves forward from the state illustrated in FIG. 10 so that a heat-receiving heat sink is elevated.

Thereafter, the up-and-down mechanism 52 operates to elevate the heat-receiving heat sink 32. Specifically, driving of rotation of the first motor 56 continues from operation of the shutter driving mechanism 50, and as illustrated in FIG. 11, the pressing part 57*a* of the slide link 57 that moves further forward contacts a corner of the up-and-down slide member 67 and presses the up-and-down slide member 67 while keeping in contact with the corner to move the up-and-down slide member 67 forward. At this time, although the slide member 58 also moves forward, since the rack gears 58*a* and 58*b* are disengaged from the pinion gears 59*a* and 63 as illustrated in FIGS. 10 and 11, the pinion gears 59*a* and 63 do not rotate.

Figure 13:
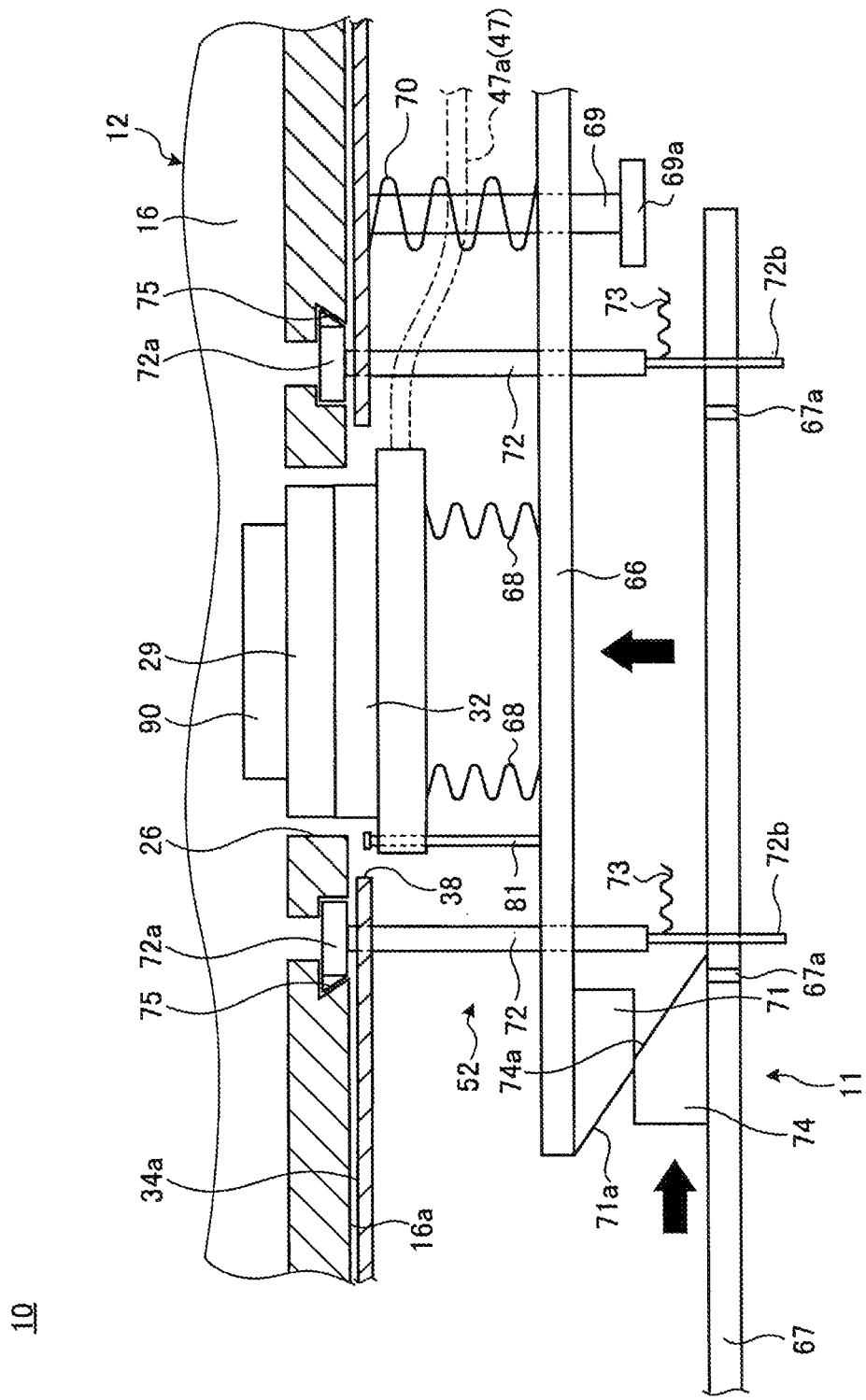
FIG. 13 is an enlarged side view of a main portion illustrating a state in which the heat-receiving heat sink is elevated from the state illustrated in FIG. 6.

When the up-and-down slide member 67 moves forward, as illustrated in FIG. 13, the slopes 74*a* of the lift members 74 become in slide contact with the slopes 71*a* of the pressure-receiving members 71 of the base plate 66 so that the base plate 66 is lifted against a biasing force of the coil springs 70. Accordingly, the heat-receiving heat sink 32 elastically supported on the base plate 66 with the coil springs 68 interposed therebetween also elevates, and a surface of the heat-receiving heat sink 32 contacts a surface of the heat-dissipation heat sink 29 of the portable information device 12 (see FIG. 13). The external screw members 72*a* also elevate together with the base plate 66 to be engaged with the internal screw holes 75 in the bottom surface 16*a* of the portable information device 12 (see FIG. 13).

In the water cooling unit 48 mounted on the cooling device 11, the pipes 47 connecting the heat-receiving heat sink 32 having a water cooling jacket structure and configured to move up and down, the radiator 44, and the circulating pump 46 are made so of a flexible hose member 47*a* (see FIG. 13). Thus, the hose member 47*a* can be flexible with respect to up-and-down movement of the heat-receiving heat sink 32, thereby preventing troubles such as water leakage.

Figure 14:
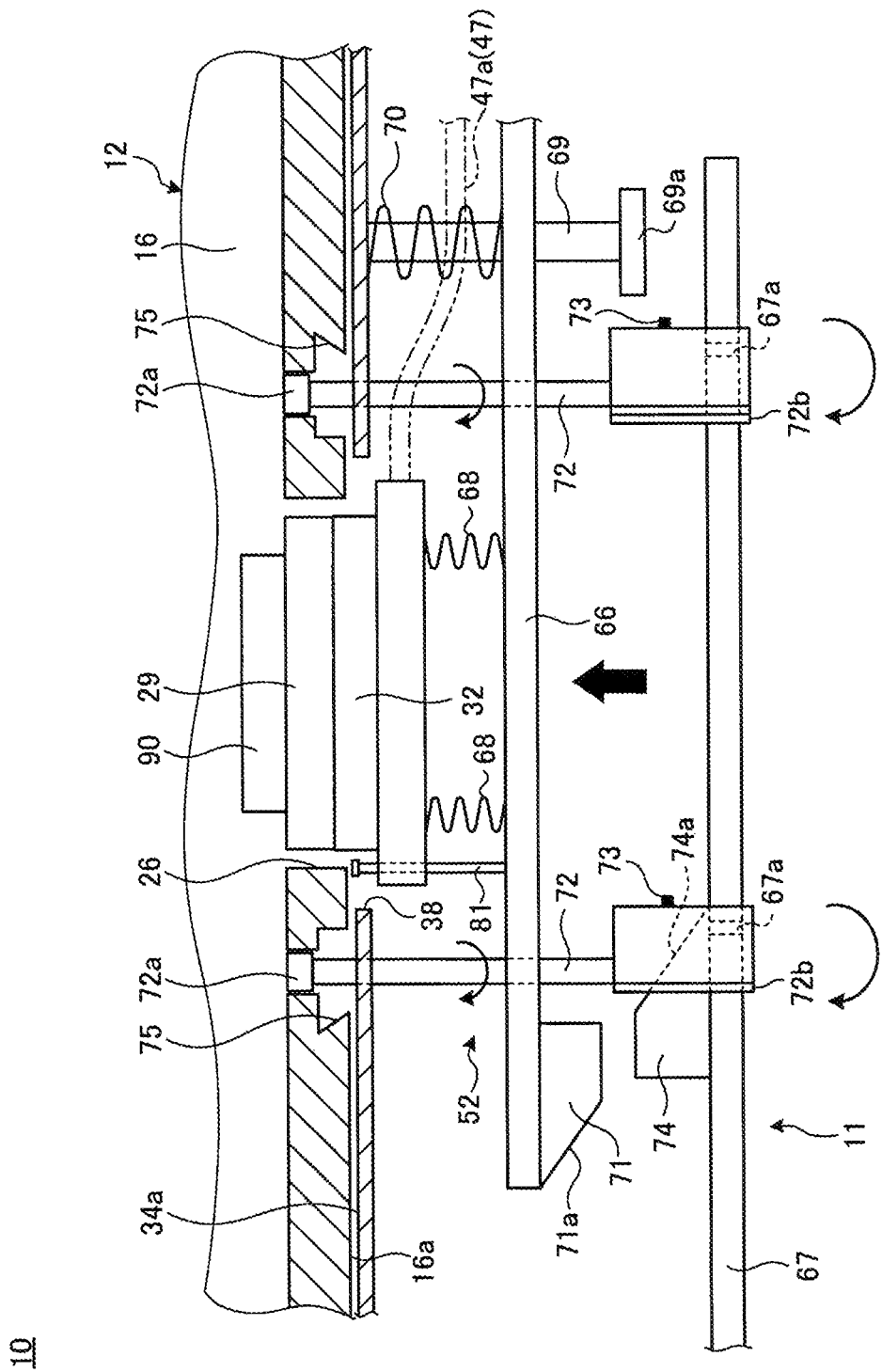
FIG. 14 is an enlarged side view of a main portion illustrating a state in which an external screw member is screwed into an internal screw hole from the state illustrated in FIG. 13.

Subsequently, as illustrated in FIG. 11, the pressure-receiving plates 72*b* of the attraction shaft members 72 are pressed by the pressing plates 67*a* of the up-and-down slide member 67 that further moves forward to rotate against a biasing force of the coil springs 73 so that the external screw members 72*a* rotate in the internal screw holes 75. Then, as illustrated in FIG. 14, the external screw members 72*a* are screwed into the internal screw holes 75 to move upward so that the base plate 66 is also lifted by the attraction shaft members 72. Consequently, the coil springs 68 are compressed between the base plate 66 and the heat-receiving heat sink 32, and the heat-receiving heat sink 32 further comes to be in pressure contact with the heat-dissipation heat sink 29 so that the heat-receiving heat sink 32 and the heat-dissipation heat sink 29 are in close contact with each other. That is, the attraction shaft members 72 provided with the external screw members 72*a* at the upper ends thereof cause the base plate 66 and the portable information device 12 to move close to each other, thereby further ensuring close contact between the heat-receiving heat sink 32 and the heat-dissipation heat sink 29.

In a state in which the external screw members 72*a* are screwed into the internal screw holes 75 to a predetermined position, the external screw members 72*a* are orthogonal to the openings of the internal screw holes 75 as illustrated in FIG. 14. That is, when the external screw members 72*a* rotate by 90 degrees, the external screw members 72*a* are screwed into the internal screw holes 75. This configuration ensures prevention of detachment of the external screw members 72a from the internal screw holes 75. Thus, even when an external force is applied to the portable information device 12 attached to the cooling device 11, close contact between the heat-receiving heat sink 32 and the heat-dissipation heat sink 29 is maintained.

Then, as illustrated in FIG. 11, when the position detecting sensor 87c for the slide member 58 detects that the slide link 57 moves forward to a predetermined forward position, the control unit 86 stops the first motor 56. In this manner, attachment of the portable information device 12 to the cooling device 11 is completed. As a result, since the heat-dissipation heat sink 29 and the heat-receiving heat sink 32 are in close contact with each other under a desired pressure with the coil springs 68 interposed therebetween, high heat transmission performance between the heat sinks 29 and 32 is obtained so that the portable information device 12 can be efficiently cooled by the water cooling unit 48.

Thereafter, in detaching the portable information device 12 from the cooling device 11, the ejecting button 37 is turned on. Accordingly, the first motor 56 is driven to rotate in a direction opposite to the direction in attaching the portable information device 12, and the slide link 57 moves rearward to the left from the attachment position illustrated in FIG. 11 to a position illustrated in FIG. 10, and the slide member 58 also moves rearward. At this time, the up-and-down slide member 67 is also caused to move rearward by a biasing force of an unillustrated elastic body to follow the pressing part 57a of the slide link 57 that moves rearward.

When the up-and-down slide member 67 moves rearward, a pressure applied from the pressing plate 67a to the pressure-receiving plates 72b of the attraction shaft members 72 is canceled. Thus, the pressure-receiving plates 72b are caused to rotate reversely by a biasing force of the attraction shaft members 72 so that the external screw members 72a rotate to be separated from the internal screw holes 75. When the up-and-down slide member 67 further moves rearward, the lift members 74 are then separated from the corresponding pressure-receiving members 71 of the base plate 66. Thus, the base plate 66 descends by a biasing force and a self-weight of the coil springs 70 and, at the same time, the heat-receiving heat sink 32 also descends. Accordingly, the external screw members 72a are completely separated from the internal screw holes 75 (see FIG. 6).

Figure 12:
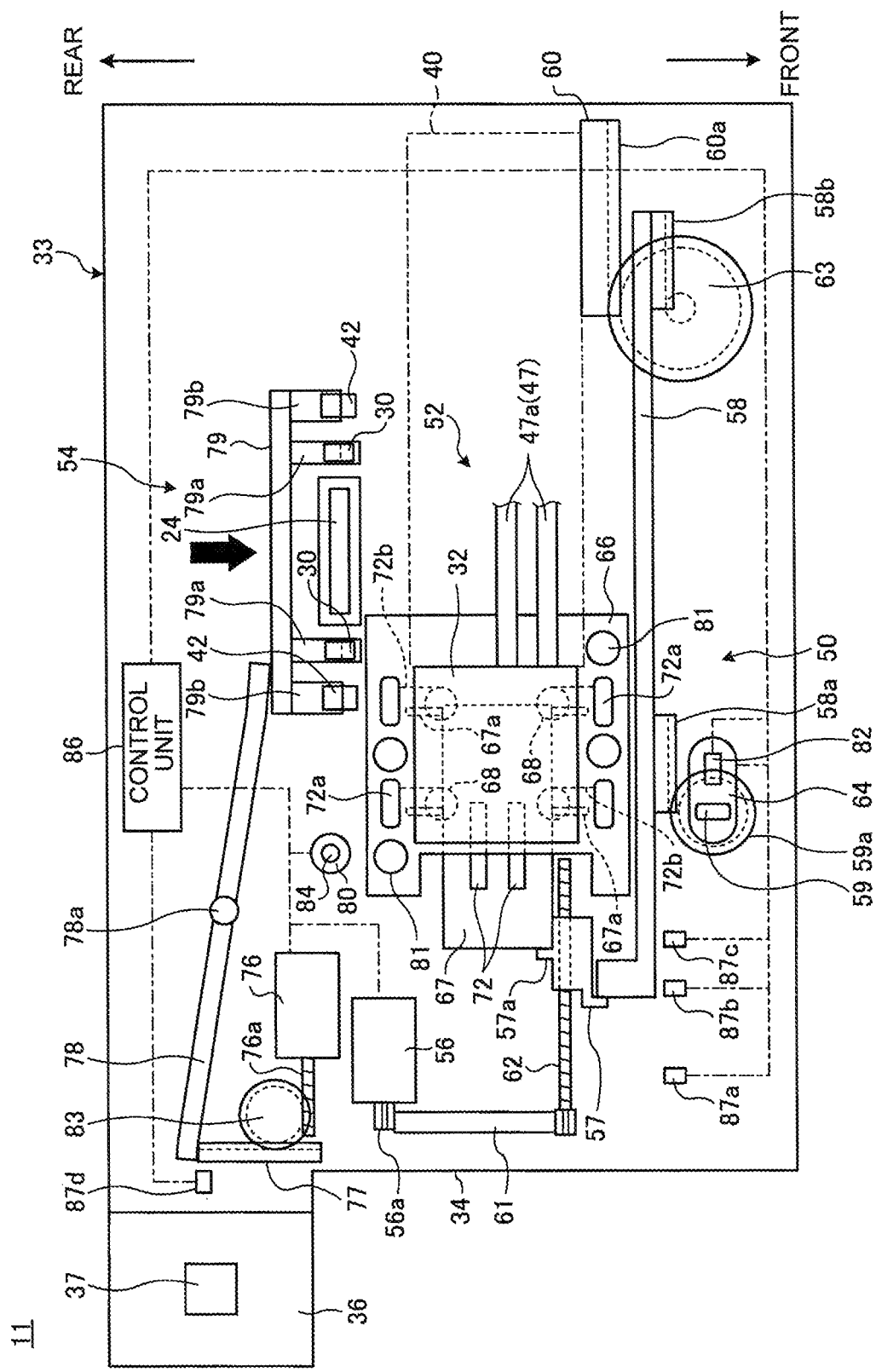
FIG. 12 is a plan view illustrating a state in which an ejecting button is operated from the state illustrated in FIG. 11.

As illustrated in FIG. 6, when the descending of the heat-receiving heat sink 32 is completed so that the slide member 58 moves to the position illustrated in FIG. 10 and is detected by the position detecting sensor 87b, the control unit 86 stops the first motor 56, and the second motor 76 is driven to rotate. Then, the ejecting rack gear 77 moves rearward through the worm gear 76a and the worm wheel 83 as illustrated in FIG. 12, and the seesaw arm 78 seesaws clockwise in the drawing. In this manner, the ejecting slide member 79 moves forward, and the disengaging parts 79a disengage the engaging levers 30 from the engaging holes 31. Subsequently, the lift parts 79b lift the ejecting members 42, and the portable information device 12 is popped up on the mount surface 34a so that the portable information device 12 is detached from the cooling device 11.

In this manner, when the portable information device 12 is detached from the cooling device 11, the ejecting rack gear 77 is detected by the position detecting sensor 87d so that the second motor 76 is stopped.

In view of this, by lifting and detaching the portable information device 12 from the mount surface 34a, the on/off sensor 80 and the off sensor 82 pressed by the bottom surface 16a of the portable information device 12 are lifted and return to initial positions (see FIGS. 7A and 8A). Consequently, the on/off sensor 80 and the off sensor 82 transmit off signals to the control unit 86. Upon receiving the two off signals, the control unit 86 causes the shutter driving mechanism 50 to perform a close operation.

The cooling device 11 is configured such that the on/off sensor 80 and the off sensor 82 are disposed at positions separated from each other in the front-rear direction on the mount surface 34a, and when both of the two sensors 80 and 82 transmit off signals, the shutter driving mechanism 50 performs a close operation. Thus, since the two off signals are not transmitted unless the portable information device 12 is completely detached from the mount surface 34a, it is possible to prevent the shutter driving mechanism 50 from performing a close operation before the portable information device 12 is completely detached. In addition, since the off sensor 82 can detect that the portable information device 12 is detached at a position higher than the on sensor 64, it is possible to prevent the shutter driving mechanism 50 from performing a close operation in a state where the portable information device 12 is slightly lifted from the mount surface 34a.

In the close operation of the shutter driving mechanism 50, first, the first motor 56 is driven to rotate again in a direction opposite to the direction in attaching the portable information device 12, then the slide link 57 moves rearward to the left from the position illustrated in FIG. 10 to the initial position illustrated, in FIG. 5, and the slide member 58 also moves rearward. Accordingly, the first rack gear 58a that is moving rearward causes the first pinion gear 59a to rotate and follow the first rack gear 58a in a direction opposite to the direction in an open operation, and reverse rotation of the apparatus shutter operating member 59 causes the opening/closing gear 65 of the portable information device 12 to rotate reversely. Consequently, the apparatus shutter members 27 and 28 are closed so that the heat-dissipation heat sink 29 is covered again (see FIG. 9A). At the same time, the second rack gear 58b that is moving rearward causes the second pinion gear 63 to rotate and follow the second rack gear 58b in a direction opposite to the direction in an open operation, and the device shutter operating member 60 is caused to move rearward through the opening/closing rack gear 60a. Consequently, the device shutter member 40 is closed so that the heat-receiving heat sink 32 is covered again (see FIG. 5).

In this manner, in the cooling device 11, after the heat-receiving heat sink 32 has descended, it is detected that the portable information device 12 is certainly lifted and detached from the mount surface 34a, and then the shutter members 27, 28, and 40 are closed. Thus, it is possible to prevent the shutter members 27, 28, and 40 from being erroneously engaged with, for example, the heat-receiving heat sink 32.

Finally, when the position detecting sensor 87a detects that the slide member 58 moves rearward to the initial position illustrated in FIG. 5, the control unit 86 turns the cooling device 11 off, and detachment of the portable information device 12 from the cooling, device 11 is completed.

As described above, in the electronic apparatus 10 according to this embodiment, the portable information device 12 includes the heat-dissipation heat sink 29 thermally connected to the heating body 90 on the bottom surface 16a of the portable information device 12 and also includes the apparatus shutter members 27 and 28 covering the heat-dissipation heat sink 29 to freely cover and uncover the heat-dissipation heat sink 29. The cooling device 11 includes the shutter driving mechanism 50 that opens the apparatus shutter members 27 and 28 when the portable information device 12 is connected to the cooling device 11 and also includes the heat-receiving heat sink 32 thermally connected to the heat-dissipation heat sink 29.

Accordingly, in a state where the portable information device 12 is not connected to the cooling device 11, the heat-dissipation heat sink 29 provided on the outer surface (bottom surface 16a) of the portable information device 12 can be covered with the apparatus shutter members 27 and 28. Thus, it is possible to prevent the hot heat-dissipation heat sink 29 from being exposed at the bottom surface 16a of the portable information device 12, and also to avoid impairment of quality of external appearance of the portable information device 12 when the portable information device 12 is used alone. In addition, in a state where the portable information device 12 is connected to the cooling device 11, the shutter driving mechanism 50 of the cooling device 11 opens the apparatus shutter members 27 and 28 so that the heat-receiving heat sink 32 is thermally connected to the heat-dissipation heat sink 29. In this manner, the heat-dissipation heat sink 29 and the heat-receiving heat sink 32 can be brought into close contact with each other in a wide contact area without another member such as a cover member interposed therebetween. Thus, sufficient heat transfer efficiency can be obtained between the cooling device 11 and the portable information device 12, and the cooling function of the portable information device 12 can be enhanced.

In the electronic apparatus 10, the cooling device 11 includes, on a surface (mount surface 34a) thereof, the heat-receiving heat sink 32 and the device shutter member 40 covering the heat-receiving heat sink 32 to freely cover and uncover the heat-receiving heat sink 32. The shutter driving mechanism 50 opens the device shutter member 40. Thus, it is possible to prevent the heat-receiving heat sink 32 that is relatively hot immediately after detachment of the portable information device 12, for example, from being exposed at the mount surface 34a, and also to avoid impairment of quality of outer appearance of the cooling device 11 when the cooling device 11 is used alone.

In particular, the electronic apparatus 10 includes the up-and-down mechanism 52 that elevates the heat-receiving heat sink 32 to bring the heat-receiving heat sink 32 into contact with the heat-dissipation heat sink 29 after the portable information device 12 has been mounted on the mount surface 34a of the cooling device 11. This configuration ensures close contact between the heat-receiving heat sink 32 and the heat-dissipation heat sink 29 even with the presence of the apparatus shutter members 27 and 28 and the device shutter member 40. The configuration including the apparatus shutter members 27 and 28 and the device shutter member 40 as described above may, of course, not include the up-and-down mechanism 52 in the cooling device 11, but may include an up-and-down mechanism that causes the heat-dissipation heat sink 29 to descend in the portable information device 12, for example.

In this case, the cooling device 11 includes the water cooling unit 48 in which the radiator 44, the heat-receiving heat sink 32, and the circulating pump 46 are connected to one another in a loop by the pipes 47 so that cooling water circulates. Thus, the cooling device 11 can efficiently cool the portable information device 12.

In the electronic apparatus 10 according to this embodiment, the portable information device 12 includes the heat-dissipation heat sink 29 disposed on the bottom surface 16a of the portable information device 12 and thermally connected to the heating body 90. The cooling device 11 includes the mount surface 34a on which the bottom surface 16a of the portable information device 12 is mounted, the heat-receiving heat sink 32 disposed on, the mount surface 34a and thermally connected to the heat-dissipation heat sink 29, and the up-and-down mechanism 52 that elevates the heat-receiving heat sink 32 toward the heat-dissipation heat sink 29 when the portable information device 12 is mounted on the mount surface 34a.

Thus, after the portable information device 12 has been mounted on the mount surface 34a of the cooling device 11, the heat-receiving heat sink 32 elevates to contact the heat-dissipation heat sink 29. This configuration ensures close contact between the heat-receiving heat sink 32 and the heat-dissipation heat sink 29, thereby obtaining high heat transfer efficiency.

In particular, in the electronic apparatus 10, since the heat-dissipation heat sink 29 of the portable information device 12 and the heat-receiving heat sink 32 of the cooling device 11 are covered with the apparatus shutter members 27 and 28 and the device shutter member 40, respectively, it is difficult to bring the heat-receiving heat sink 32 and the heat-dissipation heat sink 29 into close contact with each other only by mounting the portable information device 12 on the mount surface 34a. In view of this, the electronic apparatus 10 has the configuration in which the shutter driving mechanism 50 opens the apparatus shutter members 27 and 28 and the device shutter member 40 and then the up-and-down mechanism 52 elevates the heat-receiving heat sink 32 to bring the heat-receiving heat sink 32 into close contact with the heat-dissipation heat sink 29. Thus, it is possible to ensure close contact between the heat-receiving heat sink 32 and the heat-dissipation heat sink 29 even with the presence of the apparatus shutter members 27 and 28 and the device shutter member 40. The thus-configured up-and-down mechanism 52 may, of course, not include the apparatus shutter members 27 and 28 and the device shutter member 40. In this case, the up-and-down mechanism 52 can be effectively used.

As has been described, the present invention provides a cooling device for cooling a portable information device.

With the current embodiment, the portable information device 12 and the cooling device 11 include the apparatus shutter members 27 and 28 and the device shutter member 40. Alternatively, as long as the portable information device 12 that can be used alone includes the apparatus shutter members 27 and 28, for example, the cooling device 11 may not include the device shutter member 40. The apparatus shutter members 27 and 28 are not necessarily provided as a pair, and only one of the apparatus shutter members 27 and 28 may be used in a manner similar to that of the device shutter member 40.

With the present embodiment, the cooling device 11 includes the water cooling unit 48. Alternatively, the water cooling unit 48 may be replaced by an air cooling unit.

While the invention has been particularly shown and described with reference to a preferred embodiment, it will be understood by those skilled in the art that various changes in form and detail, may be made therein without departing from the spirit and scope of the invention.

What is claimed is:
1. An electronic apparatus comprising:
a portable information device having a heating body, wherein said portable information device includes a heat-dissipation heat sink thermally connected to said heating body, and an apparatus shutter member con- figured to cover said heat-dissipation heat sink so that said heat-dissipation heat sink is freely covered and uncovered; and a cooling device detachably connected to said portable information device and is configured to absorb heat from said heating body, wherein said cooling device includes a shutter driving mechanism that opens said apparatus shutter member when said portable information device is connected to said cooling device, and a heat-receiving heat sink thermally connected to said heat-dissipation heat sink.

2. The electronic apparatus of claim 1, wherein said heat-dissipation heat sink and said apparatus shutter member are disposed on a bottom surface of said portable information device.

3. The electronic apparatus of claim 1, wherein said cooling device includes a device shutter member configured to cover said heat-receiving heat sink so that said heat-receiving heat sink is freely covered and uncovered.

4. The electronic apparatus of claim 3, wherein said shutter driving mechanism opens said device shutter member.

5. The electronic apparatus of claim 3, wherein said heat-receiving heat sink and said device shutter member are disposed on a mount surface of said cooling device.

6. The electronic apparatus of claim 5, wherein said cooling device includes a detection unit configured to detect that said portable information device is mounted on said mount surface.

7. The electronic apparatus of claim 6, wherein said shutter driving mechanism includes a motor that is driven when said detection unit detects that said portable information device is mounted on said mount surface;

an apparatus shutter operating member that is engaged with an opening/closing member configured to move in conjunction with said apparatus shutter member of said portable information device when said portable information device is mounted on said mount surface and that, when said motor is driven, opens said apparatus shutter member by driving said opening/closing member; and a device shutter operating member that opens said device shutter member when said motor is driven.

8. The electronic apparatus of claim 3, wherein said cooling device includes an up-and-down mechanism that elevates said heat-receiving heat sink towards said heat-dissipation heat sink to bring said heat-receiving heat sink into pressure contact with said heat-dissipation heat sink after said shutter driving mechanism has opened said apparatus shutter member and said device shutter member.

9. The electronic apparatus of claim 1, wherein said cooling device includes a water cooling unit in which a radiator, said heat-receiving heat sink, and a circulating pump are connected to one another in a loop by pipes for circulating cooling water.

10. The electronic apparatus of claim 1, wherein said portable information device includes a locking unit configured to lock said apparatus shutter member at a closed position.

11. The electronic apparatus of claim 1, wherein said cooling device includes an unlocking unit configured to unlock said locking unit before said shutter driving mechanism opens said apparatus shutter member.

* * * * *